United States Patent [19]
Ishijima et al.

[11] 4,227,121
[45] Oct. 7, 1980

[54] WAVEFORM OBSERVING METHOD AND APPARATUS

[75] Inventors: Yasumori Ishijima, Kodaira; Rikichi Murooka, Komae, both of Japan

[73] Assignee: Tektronix, Inc., Beaverton, Oreg.

[21] Appl. No.: 922,927

[22] Filed: Jul. 7, 1978

[30] Foreign Application Priority Data

Jul. 7, 1977 [JP] Japan .................................. 52/81352

[51] Int. Cl.² ........................ H01J 29/70; H01J 29/72
[52] U.S. Cl. ..................................... 315/367; 315/364
[58] Field of Search ................ 315/364, 365, 367, 409

[56] References Cited

U.S. PATENT DOCUMENTS 3,725,723   4/1973   Colston et al. ...................... 315/367

Primary Examiner—Theodore M. Blum
Attorney, Agent, or Firm—George T. Noe

[57] ABSTRACT

A waveform observing method and apparatus incorporating signal sampling and digital technologies is disclosed. An input signal to be observed is compared with the output from a digital-to-analog converter and the comparison output is used for controlling display means such as a cathode-ray tube. A wideband input signal can be measured with much higher accuracy than the conventional apparatus.

9 Claims, 6 Drawing Figures

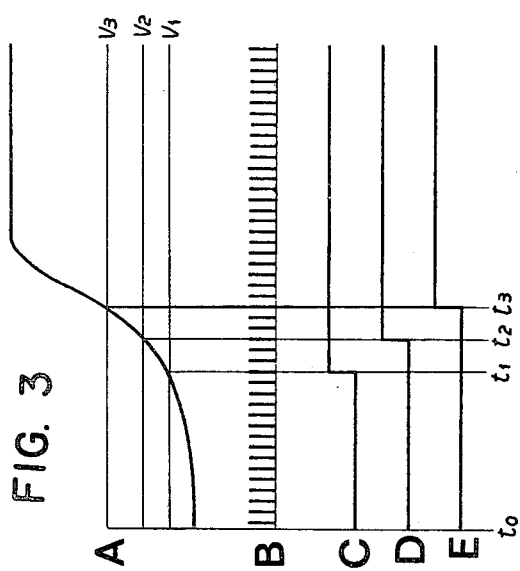
FIG. 3
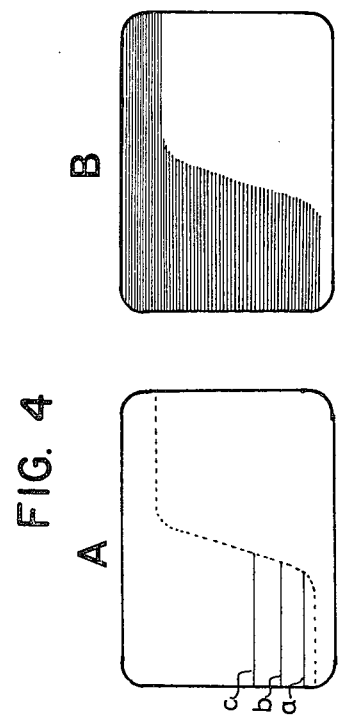
FIG. 4
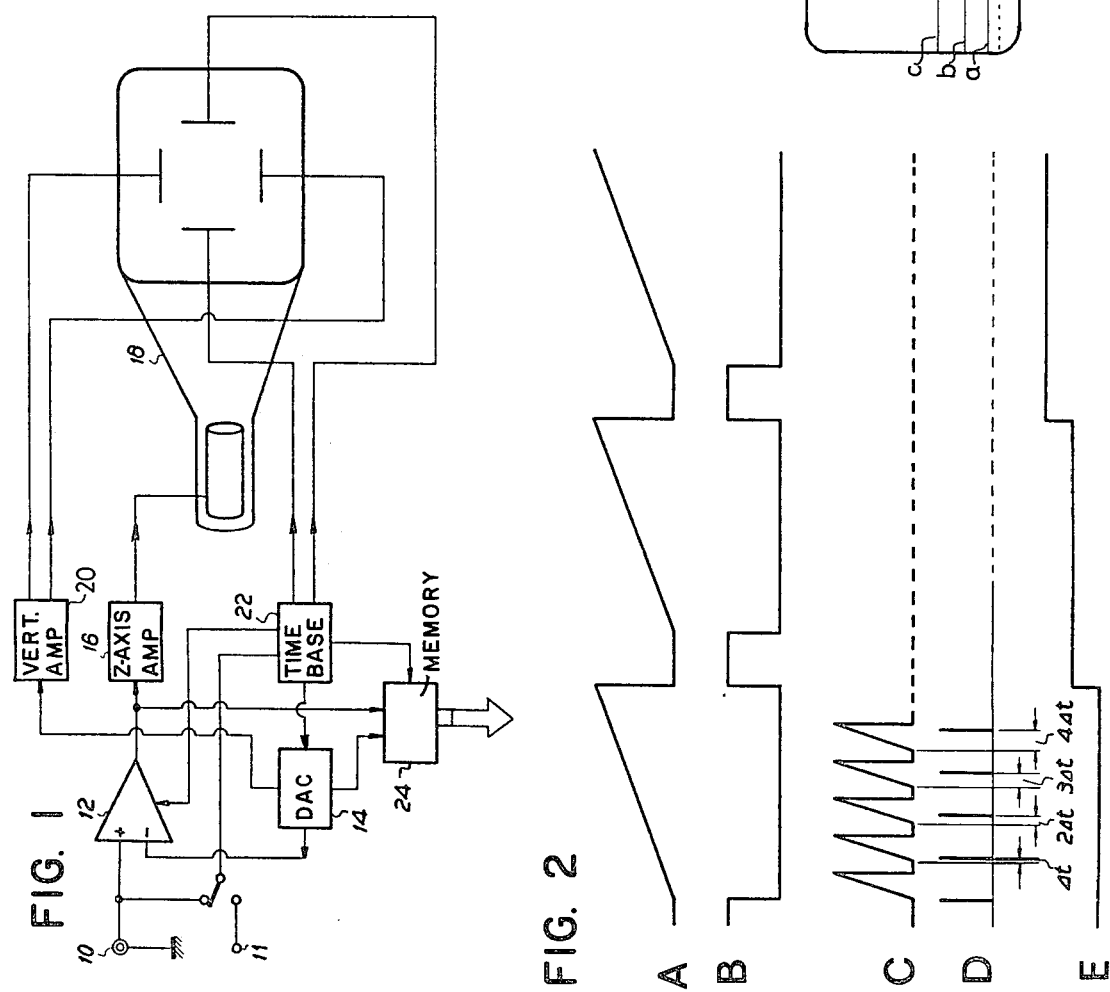
FIG. 1
FIG. 2

WAVEFORM OBSERVING METHOD AND APPARATUS

BACKGROUND OF THE INVENTION

The present invention relates to a waveform observing apparatus for sequentially scanning recording means such as an electron beam or a recording pen of a cathode-ray tube, X-Y recorder or the similar planar display apparatus for a plurality of times in a predetermined manner and modulating the recording means in accordance with an input signal to be observed for reproducing the waveform thereof.

Examples of such waveform observing apparatus are oscilloscopes and oscillographs which are being used in various fields. In these conventional apparatus, the electron beam of a cathode-ray tube (hereinafter referred to as a CRT) or the recording pen moving on a recording paper is deflected or moved in orthogonal two directions (X- and Y-axes); one (for example X-axis) represents the time axis to which a sweep signal varying linearly with time is applied; and the other (Y-axis) is controlled by an input signal voltage to be observed. The electron beam or the pen position is deflected or moved in accordance with the input voltage as a function of time and displaying or recording the trace of the input signal waveform on the screen of the CRT or on the recording paper.

The conventional waveform observing apparatus, however, has disadvantages that the use of analog signal processing means limits the measurement accuracy to approximately a few percent which is much lower than 0.1 percent or so required in many high precision applications and that the measurements are not in such a form that is convenient for storage or further arithmetic processing.

SUMMARY OF THE INVENTION

According to the present invention, the use of sampling and digital technologies permits the wideband signal measurement of the conventional sampling oscilloscope with improved accuracy as high as 0.1 percent or better of the conventional digital-to-analog converters (hereinafter referred to as a DAC). The displayed waveform consists of a plurality of parallel lines densely positioned and modulated in accordance with the input signal, so that the modulated boundaries of the parallel lines represent the input signal waveform. Digital outputs representing both of the signal and timing information are also obtained for digital storage for a controllable finite time or for further arithmetic processing.

The object of the present invention is to overcome the disadvantages of the conventional waveform observing apparatus and to provide a unique waveform observing method and apparatus of displaying a fast input signal waveform with high precision as well as obtaining a digital output, if necessary, for recording, calculating, or other processing.

This invention is pointed out with particularity in the appended claims. A more thorough understanding of the above and further objects and advantages of this invention may be obtained by referring to the following description of a preferred embodiment taken in conjunction with the accompanying drawings.

BRIEF DESCRIPTION OF THE DRAWINGS

FIG. 1 is a block diagram illustrating the principle of one embodiment according to the present invention;

FIGS. 2 and 3 show waveforms for explaining the operation of the circuit shown in FIG. 1;

FIG. 4 shows one example of a waveform displayed by the apparatus in FIG. 1.

DETAILED DESCRIPTION OF THE INVENTION

Figure 5A:
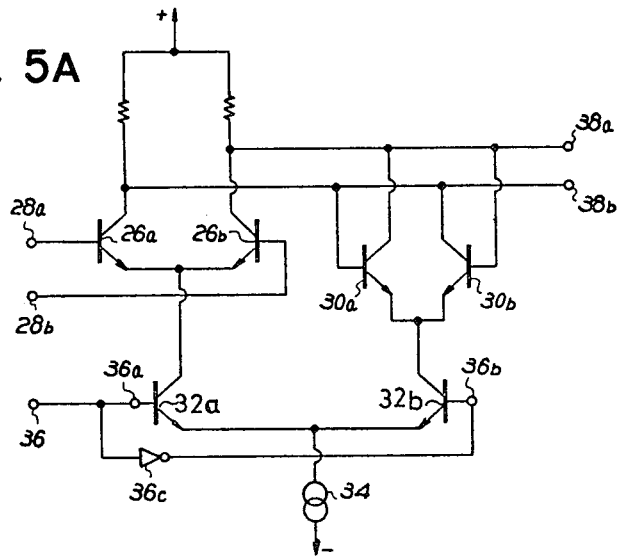
FIG. 5A and 5B are a preferred circuit schematics of a comparator shown in FIG. 1.

In FIG. 1, an input signal to be observed is applied to the non-inverting input terminal of a comparator 12 through an input terminal 10 and, if necessary, an input circuit (not shown) including an attenuator and a buffer amplifier. An external trigger signal is applied to a terminal 11. A reference output voltage from a DAC 14 is applied to the inverting input terminal of the comparator 12 as a reference input. The output from the comparator 12 is supplied to a Z-axis amplifier 16 for intensity control or modulation. The Z-axis amplifier 16 provides its output to an appropriate intensity control electrode, for example, the control grid, cathode, or blanking deflection plates of an electron gun in a CRT 18 after amplification to a desired amplitude and polarity. The output of the DAC 14 is also applied to the vertical deflection plates of the CRT 18 after converting it into a push-pull output by a vertical amplifier 20.

Referring to a timebase circuit 22 in FIG. 1, a push-pull slow ramp or staircase signal for driving the horizontal deflection plates of the CRT 18 is compared with a fast ramp signal generated in synchronism with the input signal to be observed and a narrow strobe pulse is generated whenever they coincide for driving the comparator 12. A digital processing circuit 24 is added to store and arithmetically process the digital outputs from the DAC 14 and the comparator 12.

Now, the operation of the apparatus in FIG. 1 is described by reference to FIGS. 2 through 4. Shown in FIG. 2 is the outline of the operation for the apparatus in FIG. 1, especially the timebase circuit 22. FIG. 3 shows the detailed operation of the apparatus, especially the comparator 12. FIGS. 4A and B show respectively partial and entire signal waveforms displayed on the CRT screen as an example.

Shown n FIG. 2A is the slow ramp (or sweep) signal from the timebase circuit 22 to be applied to one of the horizontal deflection plates of the CRT 18. The slow ramp signal is generated at a controllable constant period. Shown in FIG. 2B is a reset pulse for the slow ramp signal of FIG. 2A. Shown in FIG. 2C is a fast ramp signal to be generated in synchronism with the input signal to be observed. The frequency of the fast ramp signal is several hundreds to several thousands times higher than that of the slow ramp signal. Shown in FIG. 2D is a narrow strobe pulse train which is generated whenever the fast ramp signal in FIG. 2C coincides in amplitude with the slow ramp signal in FIG. 2A. Shown in FIG. 2E is a reference voltage output from the DAC 14. The reference voltage output increases (or decreases) by one bit unit at every generation of the reset pulse (see FIG. 2B) for the slow ramp signal in FIG. 2A. The reference voltage waveform in FIG. 2E is also applied to the vertical deflection plates of the CRT 18, so that the electron beam of the CRT 18 is sequentially scanned across the entire screen from the bottom to the top (in a similar manner to a television raster). If no output is applied to the Z-axis amplifier 16 from the comparator 12, each scanning line remains constant brightness. The entire screen may be either light or dark.

Actually, a digital voltage, which is either "H" (high) or "L" (low), is applied from the comparator 12 to the Z-axis amplifier 16. Each scanning line is, therefore, modulated in two tones-either bright or dark-depending upon the amplitude relationship between the input signal to be observed and the reference voltage from the DAC 14. This will be described in detail by reference to FIG. 3.

FIG. 3A shows one example of the input signal to be observed, which is represented by the voltage amplitude (vertical axis) against time (horizontal axis). The levels $V_1$, $V_2$ and $V_3$ superimposed with the input signal waveform in FIG. 3A are the reference output from the DAC 14 in FIG. 2E at different timing. Shown in FIG. 3B is the strobe pulse train of FIG. 2D to be applied to the comparator 12. Shown FIGS. 3C, D and E are comparison outputs from the comparator 12 at the specific time when the reference voltages $V_1$, $V_2$ and $V_3$ are applied from the DAC 14 to the comparator 12. That is, the comparator 12 compares the input signal to be observed and the reference voltage whenever each strobe pulse is applied and latches the comparison output.

When the reference voltage from the DAC 14 is $V_1$, the output of the comparator 12 remains L during the period ($t_0$-$t_1$) and changes to H at time $t_1$; thereafter remaining H until time $t_n$. The waveform in FIG. 3C will result at the output of the comparator 12. Similarly, when the reference voltage is $V_2$, the output of the comparator 12 is L during the period ($t_0$-$t_2$) and H during the subsequent period ($t_2$-$t_n$) as shown in FIG. 3D. When the reference voltage is $V_3$, the transition in the comparison output from L to H level takes place at time $t_3$. As understood from FIG. 3, varying the reference voltages from the DAC 14 to $V_1$, $V_2$ and $V_3$ will result in shifting the transition timing of the comparison output to $t_1$, $t_2$ and $t_3$, respectively. The resulting display on the CRT screen will be divided into bright and dark portions as shown by solid lines a, b and c in FIG. 4A. A very high resolution can be realized because as many as 1024 different reference voltages are available if, for example, a ten-bit DAC is used for the DAC 14. FIG. 4B shows the display on the CRT screen in such an instance and the borderline of the bright and dark areas of the plurality of scanning lines or raster will represent the waveform of the input signal to be observed as shown in FIG. 3A.

The timebase of the waveform represented by the borderline of different brightness in FIG. 4B is determined by the slope of the fast ramp signal in FIG. 2C and not affected by the slow ramp signal in FIG. 2A. This allows the apparatus to observe fast and ultra high frequency signals as is possible in the conventional sampling oscilloscope.

Although the above description was made on one example using an electrostatic deflection type CRT as the display apparatus, those skilled in the art can understand easily that any other planar display apparatus can be used. The alternative planar display apparatus includes a storage type CRT, and electrodynamic deflection type CRT, and X-Y pen recorder, or a display panel consisting of LED (light emitting diode) matrix, liquid crystal or plasma display. In addition, the comparison outputs such as FIGS. 3C, D and E are applied directly to the Z-axis of the CRT 18 in the above mentioned embodiment, but they can be applied through a differentiation circuit. The electron beam is then modulated only at one portion per every scanning line when the transition occurs in comparison output, or at time $t_1$, $t_2$, $t_3$ . . . . The resulting waveform will be similar to that in the conventional oscilloscope or oscillogram. A monostable multivibrator being triggered at time $t_1$, $t_2$, $t_3$ . . . can be used to provide the output to the Z-axis circuit.

It can be understood that the Z-axis signal corresponds to a pen up-down control signal if an X-Y pen recorder is used as a display or recording apparatus.

The digital processing circuit 24 in FIG. 1 may be either semiconductor IC or magnetic memory circuit. The memory circuit stores the digital signal from the DAC 14 (for example the output of a counter for counting the number of the slow ramp signals from the timebase circuit 22) and the digital ouput from the comparator 12 either directly or by digitizing the sweep voltage level at the transition of the comparison output of the comparator 12. The stored data can be utilized at any desired time for reproducing the signal waveform on an display apparatus.

If the digital code of the DAC 14 is stored at the instance of the transition of the comparison output, the apparatus will serve as an analog-to-digital converter for converting instantaneous amplitudes of the input signal into digital codes.

The comparator 12 in FIG. 1 may be the strobed voltage comparator commerically available from, for example, Advanced Micro-devices Corp. FIGS. 5A and B are examples of the comparator 12. Emitter coupled transistor pair 26a, 26b constitutes a differential comparator and compares the signal to be observed and the reference voltage from the DAC 14 which are applied respectively to the base input terminals 28a, 28b. A latch transistor pair 30a, 30b is cross connected to the collectors of the transistor 26a, 26b. The emitters of the latch transistor pair 30a, 30b are coupled together and output terminals 38a, 38b are connected to the collectors of these transistors 30a, 30b. The common emitters of the transistor pairs 26a–26b and 30a–30b are connected to a current switch consisting of transistors 32a, 32b. The current switch is connected at the common emitter electrodes to a current source 34 and receives at base input terminals 36a, 36b the strobe pulse generated in the timebase circuit 22 in FIG. 1 directly and through an inverter 36c, respectively.

Figure 5B:
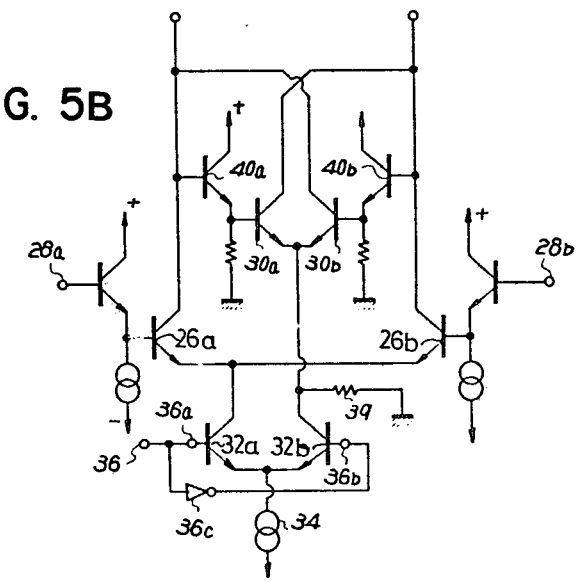

In operation, under the normal condition before the strobe pulse is applied to the terminal 36, the transistors 32a, 32b of the current switch are respectively off and on. The latch transistor pair 30a, 30b holds the state when the previous strobe pulse was applied. On applying the strobe pulse, the current switch is rapidly inverted with the transistor 32a and the transistor 32b off. The comparison in amplitude is made at this instance between the signal to be observed and the reference signal applied to the terminals 28a 28b, respectively. The resulting voltage difference appearing across collectors of the comparison transistors 26a, 26b is amplified by the latching transistors 30a, 30b constituting a positive feedback amplifier when enabled at the termination of the strobe pulse. This latches (holds) the voltage at the output terminals 30a, 30b to either H or L state. The similar operation is repeated hereinafter. Since the comparator circuit in FIG. 5B is essentially identical in construction and operation to the circuit in FIG. 5A, its detailed description will be omitted. Primary differences therebetween are that the common emitters of the transistors 30a, 30b are not only connected to the collector of the transistor 32b constituting the current switch in combination with the transistor 32a but also prebiased through a resistor 39 and an emitter follower stage 40a, 40b is inserted at the input side of the latching transistor pair 30a, 30b. Such differences provide remarkable improvement in the response time and permit a fast signal to be observed because the comparison can be made by a narrow strobe pulse.

Although the foregoing description was made on one example for observing a fast, ultra high frequency signal by equivalent time signal sampling techniques, this invention is not intended to be limited to such embodiment only but can be applied to a real time display apparatus for observing a low frequency signal.

In such a case, the slow sweep signal from the timebase circuit 22 as shown in FIG. 2A is generated in synchronism with the signal to be observed and the binary output (H or L) from the comparator 12 is used to control the Z-axis of the recording apparatus. Since the vertical deflection signal int this instance is low frequencies as shown in FIG. 2E. Thus, any problems such as drift, distortion, and nonlinear frequency response can be solved because the input signal to be observed cannot be amplified to a large amplitude up to thirty to fifty volts with high fidelity unlike a conventional oscilloscope.

Since any CRTs generally have 50 MHz or higher bandwidth, they can be used for observing considerably high frequency repetitive signals. The use of digital circuits makes it possible to store the measurements and reproduces then at any desired time. That is, the reference voltage of the DAC 14 can be extracted easily as a digital signal thus the timing information when the comparator output changes from H to L or L to H can also be stored in a digital form by simply digitizing the instantaneous values of the sweep signal.

As understood from the description hereinbefore, the waveform observing apparatus according to this invention is completely different in principle from any conventional signal display/observing apparatus which process the input signal to be observed by analog means such as amplification or attenuation for moving a recording means (such as electron beam or recording pen) on recording media (such as phosphor screen or recording paper) in response to the signal and forming a trace of such signal. That is, in the present apparatus, the voltage axis movement of the recording means is a low frequency reference signal from a DAC which is closely related to the time axis movement. The input signal to be observed is compared in amplitude with the reference voltage to provide the digital output for controlling the recording means (blanking/unblanking of an electron beam, or up/down of a pen) to display the signal waveform by the boundaries. This invention ensures highly accurate measurements of 0.1% or better determined by the accuracy of the DAC and the comparator and eliminates such undesirable problems as waveform distortion and drift due to frequency response and nonlinearity of the amplifiers in the conventional apparatus. Also, the digital output corresponding to the input signal to be observed is available for being stored in a memory circuit for a controllable time, so that reproduction of the input signal or any other digital processing can be performed at any desired time. In addition, processing such as differentiation of the output from the comparator will display a substantially continuous trace representing the input signal waveform in the similar form in appearance to the conventional waveform display apparatus.

The waveform display apparatus according to this invention may be used for various applications for observing repetitive signals but is particularly suited for measuring the settling time of operational amplifiers and DACs, and operation characteristics of devices or elements including switching (or sampling) operations such as, for example, sample-and-hold circuits (hereinafter referred to as S/H circuits) in which very high precision measurements are required. Such an application is described briefly hereinafter.

Assume that a S/H circuit is operated to sample and hold an input signal having a frequency close to or higher than its maximum sampling frequency. Then, the input signal varies significantly during two neighbouring sampling operations or sampling strobe pulses. The S/H circuit is unable to reproduce the input signal accurately on the real time basis. However, the apparatus in FIG. 1 can solve this problem. If the sampling operation of the S/H circuit is performed by using the strobe pulse as shown in FIG. 2D, the actual signal sampling takes place once every one or a plurality of cycles of the input signal on sequentially delayed point by $\Delta t$ with respect to the trigger point of the input signal. Thus, the variation of the input signal between the neighbouring sampling times is very small. The S/H circuit can accurately reproduce the input signal in a lower frequency as long as the signal is repetitive. Although not shown in the drawings, the circuit arrangement required for this application is to connect the S/H circuit to be tested between the input terminal 10 and the comparator 12 in FIG. 1. This permits the S/H circuit to be operated at around its maximum frequencies for evaluation purposes.

The invention is claimed in accordance with the following:

1. A waveform display apparatus, comprising:
   a timebase circuit for generating successive ramp signals;
   a digital-to-analog converter responsive to said ramp signals for producing an analog output signal, the amplitude of which is proportional to the number of ramp signals received;
   a comparator for generating display control signals in response to a comparison of said analog output signal and said display waveform; and
   means for displaying said waveform wherein said ramp signals provide deflection along a first display axis, said analog output provides deflection along a second display axis substantially perpendicular to said first display axis, and said display control signals control writing of the display.

2. A waveform display apparatus in accordance with claim 1 wherein said time base circuit also generates strobe pulses at a substantially constant rate, and said comparator is a strobed comparator operating in response to said strobe pulses.

3. A waveform display apparatus in accordance with claim 1 wherein said waveform displaying means is a cathode-ray tube having vertical and horizontal deflection means and writing gun control means.

4. A waveform display apparatus in accordance with claim 1 wherein said waveform displaying means is an X-Y recorder.

5. A waveform display apparatus, comprising:
a timebase circuit for generating a slow ramp signal, a fast ramp signal in synchronism with a repetitive signal to be displayed, and strobe pulses in response to the fast ramp signal successively passing through the instantaneous voltage of said slow ramp signal;
a digital-to-analog converter for producing an analog output-signal, the amplitude of which is proportional to the number of slow ramp signals;
a comparator for comparing said analog output signal with said repetitive signal to be displayed to generate control signals thereby, said comparator operating in response to said strobe pulses; and
a cathode-ray tube including orthogonal deflecting means for deflecting the electron beam thereof in response to said slow ramp signal and said analog output signal, said cathode-ray tube further including beam intensity control means responsive to said control signals.

6. A waveform display apparatus in accordance with claim 5 further including circuit means including a sample and hold circuit connected between the source of said repetitive display signal and said comparator, wherein said sample and hold circuit is operated in response to said strobe pulses.

7. A waveform display apparatus in accordance with claim 5 further including a memory circuit for storing information representative of the electron beam position of said cathode-ray tube.

8. A method for displaying the waveform of a repetitive input signal, comprising the steps of:
generating a first signal, the amplitude of which increases slowly with time;
generating a second signal in synchronism with said repetitive input signal, the amplitude of said second signal increasing linearly with time at a rate substantially faster than that of said first signal;
generating strobe pulses by comparing said second signal with said first signal;
producing an analog signal, the amplitude of which is proportional to the number of cycles of said first signal;
generating write control signals coincident with said strobe pulses by comparing the amplitude of said analog signal with said repetitive input signal; and
producing a graphic display of the waveform of said repetitive signal in response to said write control signals, wherein said first signal is utilized to provide deflection along a first display axis and said analog signal is utilized to provide deflection along a second display axis.

9. A method for displaying the waveform of a repetitive input signal in accordance with claim 8, further including the step of storing in a memory device data representative of the display coordinates of said waveform.

* * * * *

UNITED STATES PATENT AND TRADEMARK OFFICE
CERTIFICATE OF CORRECTION

PATENT NO. : 4,227,121
DATED : October 7, 1980
INVENTOR(S) : Yasumori Ishijima and Rikichi Murooka It is certified that error appears in the above-identified patent and that said Letters Patent are hereby corrected as shown below:

Col. 5, line 23, change "Since the" to --The--.

Col. 5, line 24, change "int" to --in--.

Signed and Sealed this

Tenth Day of March 1981

[SEAL]

Attest:

RENE D. TEGTMEYER

Attesting Officer     Acting Commissioner of Patents and Trademarks